(12) United States Patent
Park et al.

(10) Patent No.: US 9,123,589 B2
(45) Date of Patent: Sep. 1, 2015

(54) DISPLAY SUBSTRATE INCLUDING AN AUXILIARY ELECTRODE

(75) Inventors: Min-Wook Park, Asan-si (KR); Jong-In Kim, Suwon-si (KR); Jun-Ho Song, Seongnam-si (KR); Bum-Ki Baek, Suwon-si (KR); Young-Soo Yoon, Anyang-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 811 days.

(21) Appl. No.: 13/422,686

(22) Filed: Mar. 16, 2012

(65) Prior Publication Data

US 2012/0286274 A1 Nov. 15, 2012

(30) Foreign Application Priority Data

May 11, 2011 (KR) .................. 10-2011-0043855

(51) Int. Cl.
| | |
|---|---|
| *G02F 1/1333* | (2006.01) |
| *H01L 33/08* | (2010.01) |
| *H01L 27/12* | (2006.01) |
| *G02F 1/1362* | (2006.01) |

(52) U.S. Cl.
CPC ............ *H01L 27/124* (2013.01); *G02F 1/1362* (2013.01); *H01L 27/1255* (2013.01)

(58) Field of Classification Search
USPC .......................... 345/84–102; 257/59, 71, 72
See application file for complete search history.

(56) References Cited

U.S. PATENT DOCUMENTS

| | | | |
|---|---|---|---|
| 7,502,094 B2* | 3/2009 | Son ............................... | 349/192 |
| 7,880,833 B2* | 2/2011 | Shin et al. ..................... | 349/106 |
| 7,956,942 B2* | 6/2011 | Lee ................................ | 349/38 |
| 8,518,498 B2* | 8/2013 | Song et al. .................... | 428/1.1 |
| 8,830,152 B2* | 9/2014 | Shimoshikiryoh ............. | 345/90 |
| 2005/0122441 A1* | 6/2005 | Shimoshikiryoh ............. | 349/38 |
| 2009/0015741 A1* | 1/2009 | Kim ............................... | 349/33 |
| 2009/0167645 A1* | 7/2009 | Kishi ............................. | 345/76 |
| 2011/0242443 A1* | 10/2011 | Choi et al. ..................... | 349/38 |

FOREIGN PATENT DOCUMENTS

| | | |
|---|---|---|
| KR | 10-2007-0070405 A | 7/2007 |
| KR | 10-2009-0112087 A | 10/2009 |
| KR | 10-2010-0004302 A | 1/2010 |

* cited by examiner

*Primary Examiner* — Bradley K Smith
*Assistant Examiner* — David Goodwin
(74) *Attorney, Agent, or Firm* — Innovation Counsel LLP

(57) ABSTRACT

A display substrate includes a data line, a main gate line, and a first sub-pixel electrode formed on a base substrate. The display substrate further includes a first switching element connected to the data line. The display substrate further includes a second switching element connected to the data line, the main gate line, and a second sub-pixel electrode spaced apart from the first sub-pixel electrode. The display substrate further includes a third switching element connected to the data line and a secondary gate line adjacent to the main gate line. The display substrate further includes a shielding line spaced apart from the first and second sub-pixel electrodes, the shielding line overlapping the data line and receiving a reference voltage. The display substrate further includes an auxiliary electrode extending from the shielding line and overlapping an end electrode connected to the third switching element.

20 Claims, 9 Drawing Sheets

DISPLAY SUBSTRATE INCLUDING AN AUXILIARY ELECTRODE

CROSS-REFERENCE TO RELATED APPLICATIONS

This application claims priority under 35 U.S.C. §119 to Korean Patent Application No. 2011-43855, filed on May 11, 2011 in the Korean Intellectual Property Office KIPO, the contents of which are herein incorporated by reference in their entirety.

BACKGROUND OF THE INVENTION

1. Field of the Invention

One or more embodiments of the present invention relate to a display substrate for use in a liquid crystal display (LCD) panel. More particularly, one or more embodiments of the present invention relate to a display substrate that provides desirable transmittance and visibility.

2. Description of the Related Art

Generally, a liquid crystal display (LCD) panel includes a thin film transistor (TFT) substrate, an opposite substrate, and a liquid crystal (LC) layer. The TFT substrate includes a plurality of gate lines, a plurality of data lines crossing the gate lines, a plurality of TFTs connected to the gate lines and data lines, and a plurality of pixel electrodes connected to the TFTs. Each of the TFTs includes a gate electrode extending from a gate line, a source electrode extending to a data line, and a drain electrode spaced apart from the source electrode.

The LCD panel may not emit light itself. The LCD panel receives the light from the backside of the LCD panel such as in a back-light mode or from the front of the LCD panel such as in a front-light mode, which means that the LCD panel is a passive display panel. Thus, the aperture ratio and the transmittance of the TFT substrate are important in order to improve a display quality. In addition, the LCD panel typically has a good front visibility but has a bad side visibility. In order to improve the side visibility, a multi-domain technique may be used. In the multi-domain technique, an area in which the pixel electrode is formed is divided into a plurality of domains, and LC molecules different from each other are arranged according to each of the domains. The multi-domain technique may involve cost and/or aperture ratio issues.

SUMMARY OF THE INVENTION

One or more embodiments of the present invention are related to a display substrate that provides desirable transmittance and visibility without substantially reducing an aperture ratio.

According to an embodiment of the present invention, the display substrate includes a first switching element, a second switching element, a third switching element, a shielding line, and an auxiliary electrode. The first switching element is electrically connected to a data line, a main gate line crossing the data line, and a first sub-pixel electrode. The data line, the main gate line, and the first sub-pixel electrode are formed on a base substrate. The second switching element is electrically connected to the data line, the main gate line, and a second sub-pixel electrode spaced apart from the first sub-pixel electrode. The third switching element is electrically connected to the data line and a secondary gate line adjacent to the main gate line. The shielding line is spaced apart from the first and second sub-pixel electrodes. The shielding line overlaps the data line and receives a reference voltage. The auxiliary electrode extends from the shielding line and overlaps an end electrode that is electrically connected to the third switching element.

In an embodiment, the auxiliary electrode may at least partially overlap the end electrode.

In an embodiment, the display substrate may further include a blocking electrode disposed under the end electrode. The blocking electrode may overlap the end electrode to shield the end electrode from light.

In an embodiment, the display substrate may further include a voltage line receiving the reference voltage and disposed substantially parallel to the main gate line, wherein the blocking electrode is connected to the voltage line.

In an embodiment, the display substrate may further include a gate insulating layer disposed on the base substrate to cover the main and secondary gate lines, wherein the gate insulating layer is disposed between the blocking electrode and the end electrode.

In an embodiment, the display substrate may further include a protecting layer having first and second contact holes formed through the protecting layer. The first switching element may contact the first sub-pixel electrode through the first contact hole. The second switching element may contact the second sub-pixel electrode through the second contact hole.

In an embodiment, the auxiliary electrode may overlap the entire top surface and/or the entire bottom surface of the end electrode.

In one or more embodiments, an auxiliary capacitor may include the auxiliary electrode, the end electrode, and a protecting layer disposed between the auxiliary electrode and the end electrode. The thickness of the protecting layer may be minimized, so that the capacitance of the auxiliary capacitor may be maximized without increasing the area of the auxiliary electrode. Advantageously, the transmittance and the visibility of a display device that includes the display substrate may be maximized without reducing the aperture ratio associated with the display device.

BRIEF DESCRIPTION OF THE DRAWINGS

The above and other features and advantages of the present invention will become more apparent by describing in detailed embodiments thereof with reference to the accompanying drawings, in which.

DETAILED DESCRIPTION OF THE INVENTION

Hereinafter, the present invention will be explained in detail with reference to the accompanying drawings.

Figure 1:
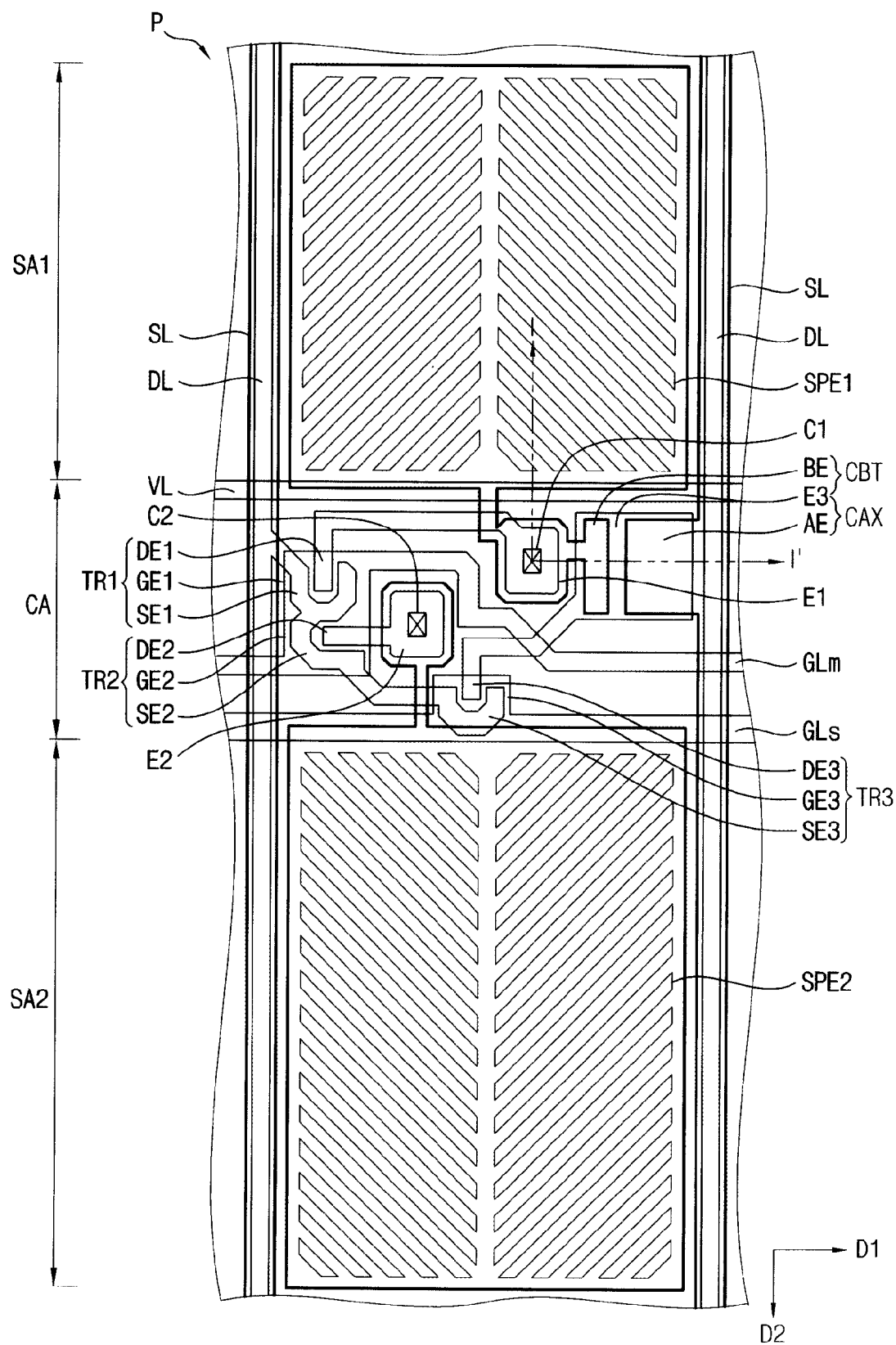
FIG. 1 is a plan view illustrating a display panel according to one or more embodiments of the present invention.

FIG. 1 is a plan view illustrating a display panel according to one or more embodiments of the present invention.

Referring to FIG. 1, the display panel includes a main gate line GLm, a secondary gate line GLs, a voltage line VL, a data line DL, a shielding line SL, and a pixel P. The pixel P includes a first switching element TR1, a first sub-pixel electrode SPE1, a second switching element TR2, a second sub-pixel electrode SPE2, a third switching element TR3, a boosting capacitor CBT, and an auxiliary capacitor CAX.

The main gate line GLm may extend in a first direction D1; the main gate line GLm and other main gate lines (associated with other pixels of the display panel) may be arranged along a second direction D2 different from (e.g., substantially perpendicular to) the first direction D1. The main gate line GLm is electrically connected to the first and second switching elements TR1 and TR2.

The secondary gate line GLs may extend in the first direction D1 substantially parallel to the main gate line GLm; the secondary gate line GLs and other secondary gate lines (associated with other pixels of the display panel) may be arranged along the second direction D2. The secondary gate line GLs is electrically connected to the third switching element TR3.

The voltage line VL may extend in the first direction D1; the voltage line VL and other voltage lines may be arranged along the second direction D2. A reference voltage Vcom may be applied to the voltage line VL.

The data line DL may extend in the second direction D2; the data line DL and other data lines of the display panel may be arranged along the first direction D1. The data line DL is electrically connected to the first, second, and third switching elements TR1, TR2, and TR3.

The shielding line SL may overlap the data line DL; the shielding line SL and other shielding lines of the display panel may be arranged along the first direction D1. The reference voltage Vcom may be applied to the shielding line SL.

The first sub-pixel electrode SPE1 is formed in a first sub-area SA1 of the pixel area and may at least partially overlap the voltage line VL. A plurality of first opening patterns (e.g., slits) is formed in the first sub-pixel electrode SPE1. The first opening patterns are substantially parallel to each other and extend in directions different from the first and second directions D1 and D2.

The first switching element TR1 includes a first gate electrode GE1 connected to the main gate line GLm, a first source electrode SE1 connected to the data line DL, and a first drain electrode DE1 electrically connected to the first sub-pixel electrode SPE1. The first drain electrode DE1 is connected to the first sub-pixel electrode SPE1 through a first contact hole C1 formed on the first end electrode E1.

The second sub-pixel electrode SPE2 is formed in a second sub-area SA2 of the pixel area and may at least partially overlap the secondary gate line GL. A plurality of second opening patterns (e.g., slits) is formed in the second sub-pixel electrode SPE2. The second opening patterns are substantially parallel to each other and extend in directions different from the first and second directions D1 and D2.

The second switching element TR2 includes a second gate electrode GE2 connected to the main gate line GLm, a second source electrode SE2 connected to the data line DL, and a second drain electrode DE2 electrically connected to the second sub-pixel electrode SPE2. The second drain electrode DE2 is connected to the second sub-pixel electrode SPE2 through a second contact hole C2 formed on the second end electrode E2.

The third switching element TR3 includes a third gate electrode GE3 connected to the secondary gate line GLs, a third source electrode SE3 connected to the data line DL, and a third drain electrode DE3 electrically connected to the boosting capacitor CBT.

The boosting capacitor CBT includes a boosting electrode BE connected to the first sub-pixel electrode SPE1 and at least partially overlapping a third end electrode E3 of the third drain electrode DE3.

The auxiliary capacitor CAX includes an auxiliary electrode AE connected to the shielding line SL and at least partially overlapping the third end electrode E3 of the third drain electrode DE3.

The pixel P may further include a first storage capacitor and a second storage capacitor. The first storage capacitor may be defined by an area in which the first sub-pixel electrode SPE1 and the voltage line VL overlap each other. The second storage capacitor may be defined by an area in which the second sub-pixel electrode SPE2 and the secondary gate line GLs overlap each other.

As shown in FIG. 1, the pixel P may include a first sub-area SA1, a second sub area SA2, and a circuit area CA. In the first sub-area SA1, a first LC capacitor may be defined by an area in which the first sub-pixel electrode SPE1 is formed. In the second sub-area SA2, a second LC capacitor may be defined by an area in which the second sub-pixel electrode SPE2 is formed. The first, second, third switching elements TR1, TR2, and TR3, the boosting capacitor CBT, the auxiliary capacitor CAX, the first contact hole C1, and the second contact hole C2 may be formed in the circuit area CA.

Figure 2A:
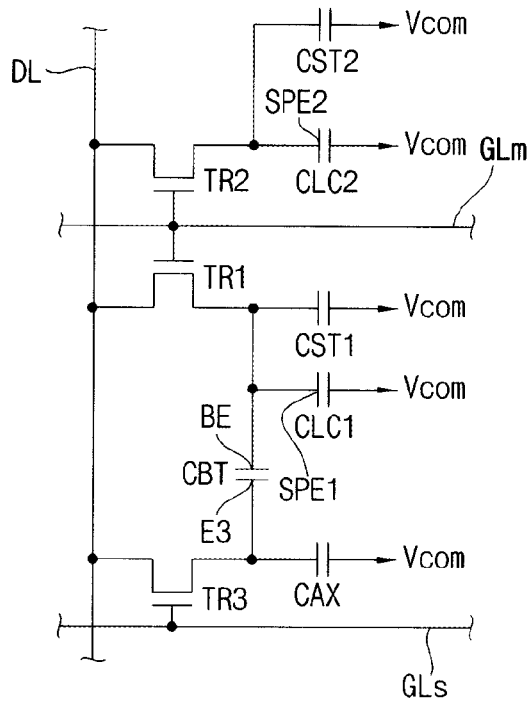
FIG. 2A is an equivalent circuit diagram illustrating a pixel of FIG. 1.
Figure 2B:
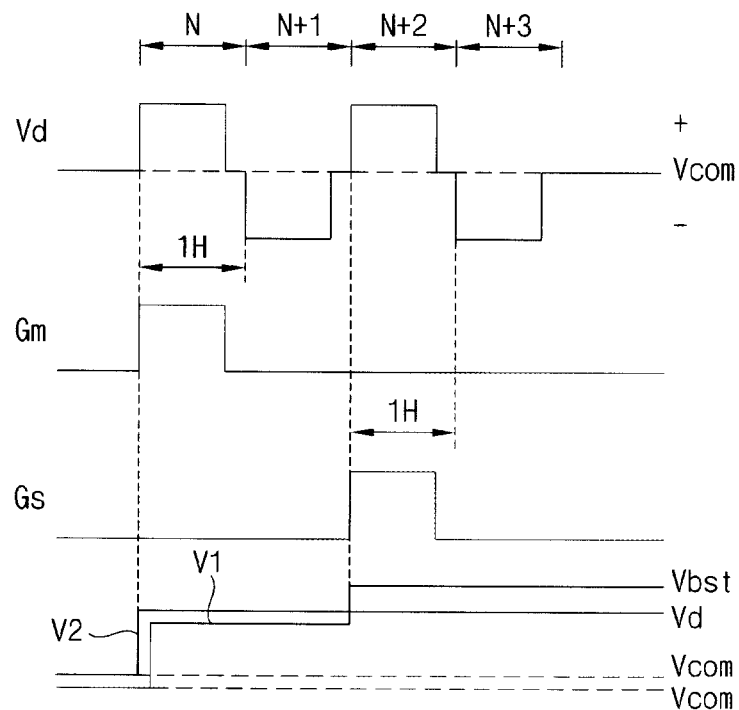
FIG. 2B is a waveform diagram illustrating a method of driving the pixel of FIG. 1.

FIG. 2A is an equivalent circuit diagram illustrating the pixel P of FIG. 1. FIG. 2B is a waveform diagram illustrating a method of driving the pixel of FIG. 1.

Referring to FIGS. 1, 2A, and 2B, the pixel P includes the first switching element TR1, the second switching element TR2, the third switching element TR3, the first LC capacitor CLC1, the first storage capacitor CST1, the second LC capacitor CLC2, the second storage capacitor CST2, the boosting capacitor CBT, and the auxiliary capacitor CAX.

When a main gate signal Gm is applied to the main gate line GLm, the first and second switching elements TR1 and TR2 are turned on. Thus, a data voltage Vd applied to the data line DL is provided to each of the first LC capacitor CLC1, the first storage capacitor CST1, the second LC capacitor CLC2, the second storage capacitor CST2, and the boosting capacitor CBT. Therefore, a difference voltage between the data voltage Vd and the reference voltage Vcom is charged at each of the first LC capacitor CLC1, the first storage capacitor CST1, the second LC capacitor CLC2, and the second storage capacitor CST2.

When a secondary gate signal Gs is applied to the secondary gate line GLs, the third switching element TR3 is turned on so that the data voltage Vd applied to the data line DL is provided to the end electrode E3 of the boosting capacitor CBT. The end electrode E3 of the boosting capacitor CBT may be provided a data voltage different from the data voltage Vd. When the data voltage applied to the first electrode E3 is the data voltage Vd, the boosting capacitor CBT boosts up a voltage applied to the boosting electrode BE to be a boosting voltage Vbst to hold the voltage difference. Therefore, the boosting voltage Vbst is applied to the first sub-pixel electrode SPE1 of the first LC capacitor CLC1 connected to the boosting electrode BE of the boosting capacitor CBT.

When the main gate signal Gm is applied to the main gate line GLm, the auxiliary capacitor CAX decreases a voltage change and a kickback voltage of the third switching element TR3 connected to the auxiliary capacitor CAX so that a voltage of the first sub-pixel electrode SPE1 may be easily boosted up to be the boosting voltage Vbst.

The secondary gate line GLs is electrically connected to a next main gate line. The next main gate line is electrically connected to a pixel including first and second sub-pixel electrodes receiving a data voltage having a polarity substantially same as the data voltage Vd with respect to the reference voltage Vcom. As shown in FIG. 2B, in one or more embodiments, the data voltage Vd is reversed using one dot inversion method for applying the data voltage Vd. In one more embodiments, if the main gate line GLm is referred to as an N-th main gate line, the secondary gate line GLs may be connected to an (N+2)-th main gate line in an peripheral area of the display panel (wherein N is a natural number). An (N+1)-th main gate line may be disposed between the N-th main gate line and the (N+2)-th gate line. Alternatively or additionally, the secondary gate line GLs may be connected to at least one of an (N+2n)-th main gate line, such as an (N+4)-th main gate line or an (N+6)-th main gate line, wherein n is greater than 1.

The second sub-pixel electrode SPE2 of the second LC capacitor CLC2 receives the data voltage Vd when the main gate line GLm receives the main gate signal Gm. The first sub-pixel electrode SPE1 of the first LC capacitor CLC1 receives the data voltage Vd in response to the main gate signal Gm and receives the boosting voltage Vbst when the secondary line GLs receives the secondary gate signal Gs.

As a result, a voltage ratio V1/V2, which is a ratio of a first voltage V1 applied to the first sub-pixel electrode SPE1 with respect to a second voltage V2 applied to the second sub-pixel electrode SPE2, may be substantially increased. Advantageously, the transmittance and visibility of the pixel P may be substantially improved. The voltage ratio V1/V2 between the first and second voltages V1 and V2 may be changed according to the configurations of the boosting capacitor CBT and the auxiliary capacitor CAX.

Figure 3:
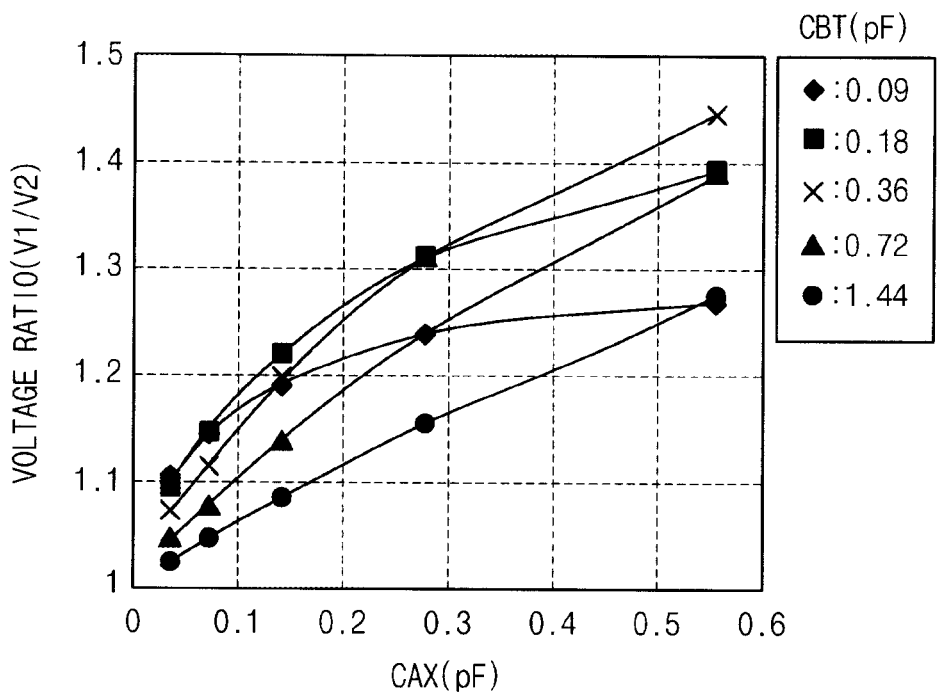
FIG. 3 is a graph illustrating a voltage ratio according to a capacitance of an auxiliary capacitor of FIG. 2A.

FIG. 3 is a graph illustrating the voltage ratio V1/V2 according to the capacitance of the auxiliary capacitor CAX of FIG. 2A.

Referring to FIGS. 2A and 3, if the capacitance of the boosting capacitor CBT remains constant, the voltage ratio V1/V2 may depend on the capacitance of the auxiliary capacitor CAX.

For example, if the capacitance of the boosting capacitor CBT is about 0.18 pF, the voltage ratio V1/V2 is as follows: if the capacitance of the auxiliary capacitor CAX is about 0.2 pF, the voltage ratio V1/V2 is about 1.28. If the capacitance of the auxiliary capacitor CAX is about 0.4 pF, the voltage ratio V1/V2 is about 1.35. If the capacitance of the auxiliary capacitor CAX is about 0.55 pF, the voltage ratio V1/V2 is about 1.38.

Therefore, if the capacitance of the auxiliary capacitor CAX is increased, the voltage ratio V1/V2 is increased.

Figure 4:
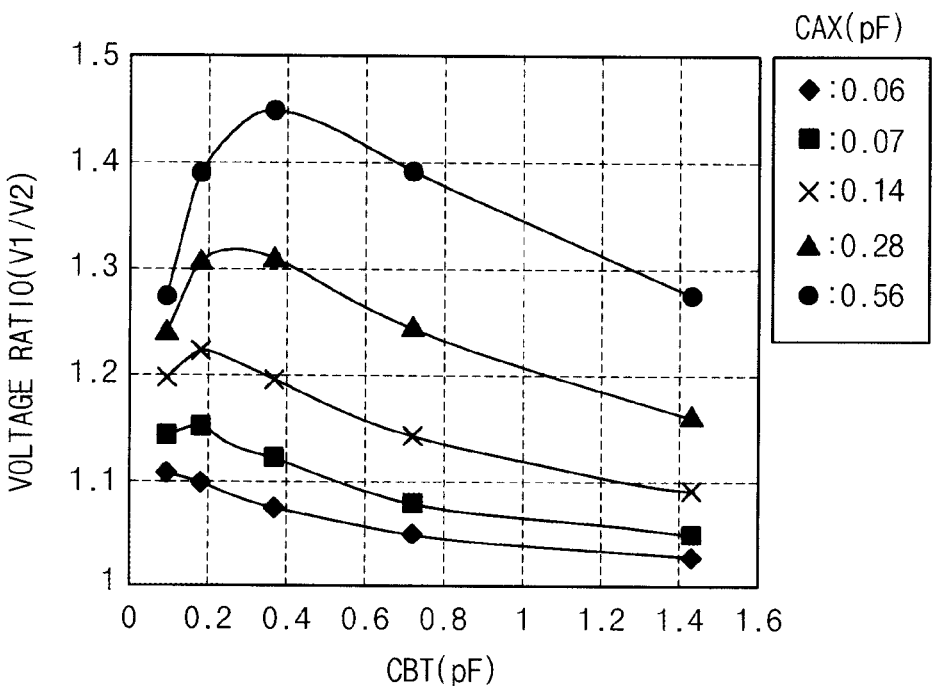
FIG. 4 is a graph illustrating a voltage ratio according to a capacitance of a boosting capacitor of FIG. 2A.

FIG. 4 is a graph illustrating the voltage ratio V1/V2 according to the capacitance of the boosting capacitor CBT of FIG. 2A.

Referring to FIGS. 2A and 4, when the capacitance of the auxiliary capacitor CAX remains constant, the voltage ratio V1/V2 may depend on the capacitance of the boosting capacitor CBT.

For example, given that the capacitance of the auxiliary capacitor CAX remains constant at about 0.06 pF, if the capacitance of the boosting capacitor CBT is about 0.1 pF, the voltage ratio V1/V2 was about 1.11, which is a maximum. Given that the capacitance of the auxiliary capacitor CAX remains constant at about 0.28 pF, if the capacitance of the boosting capacitor CBT is about 0.3 pF, the voltage ratio V1/V2 was about 1.32, which is a maximum. Given that the capacitance of the auxiliary capacitor CAX remains constant at about 0.56 pF, if the capacitance of the boosting capacitor CBT is about 0.39 pF, the voltage ratio V1/V2 was about 1.46, which is a maximum.

As can be appreciated from FIG. 4 and the examples, if the capacitance of the auxiliary capacitor CAX is increased, the maximum of the voltage ratio V1/V2 is increased. In addition, given that the capacitance of the auxiliary capacitor CAX is set to be a value between 0.07 and 0.56, the capacitance of the boosting capacitor CBT between about 0.18 pF to about 0.4 pF may provide a maximum for the voltage ratio V1/V2.

As described in FIGS. 3 and 4, as the capacitance of the auxiliary capacitor CAX is increased, the voltage ratio V1/V2 of the first and second voltages applied to the first and second sub-pixel electrodes of the pixel is increased. Therefore, the capacitance of the auxiliary capacitor CAX may be increased to improve the transmittance and visibility of the pixel.

Figure 5:
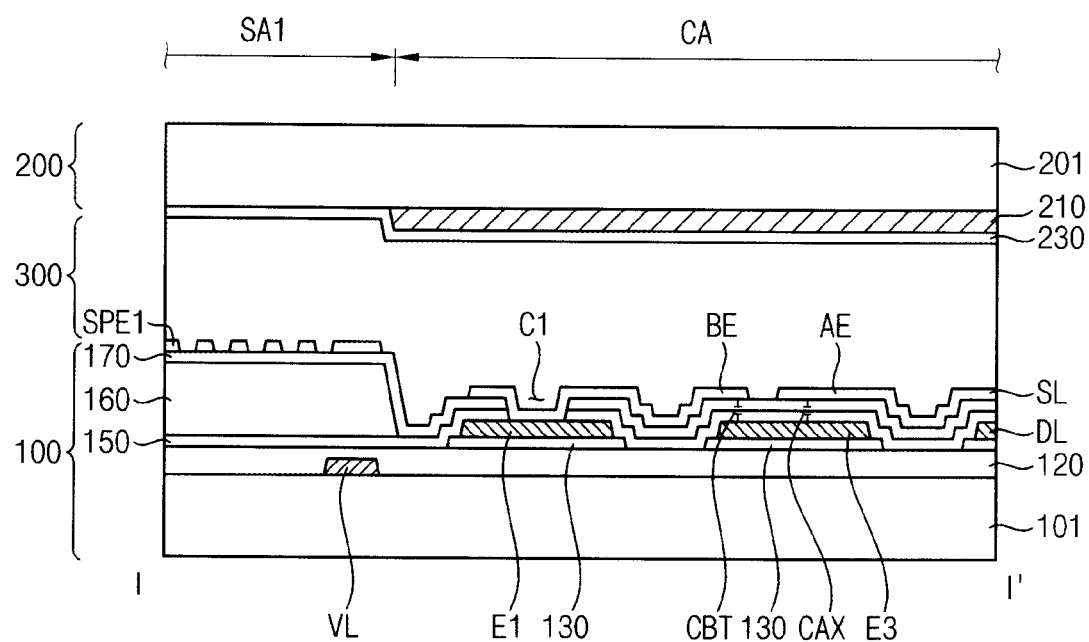
FIG. 5 is a cross-sectional view of the display panel taken along a line I-I' of FIG. 1.

FIG. 5 is a cross-sectional view of the display panel taken along a line I-I' of FIG. 1.

Referring to FIGS. 1 and 5, the display panel includes a display substrate 100, an opposite substrate 200, and an LC layer 300.

The display substrate 100 includes a first base substrate 101. The display substrate 100 includes the main gate line GLm, the secondary gate line GLs, the voltage line VL, the data line DL, the shielding line SL, the first switching element TR1, the first sub-pixel electrode SPE1, the second switching element TR2, the second sub-pixel electrode SPE2, the third switching element TR3, the boosting capacitor CBT, and the auxiliary capacitor CAX, which are formed on the first base substrate 101. The display substrate 100 further includes a gate insulating layer 120, a protecting layer 150, an organic layer 160, and a capping layer 170.

The main gate line GLm, the secondary gate line GLs, the first gate electrode GE1, the second gate electrode GE2, the third gate electrode GE3, and the voltage line VL may be first metal patterns which are formed at substantially a same metal layer. The gate insulating layer 120 is formed on the base substrate 101 on which the first metal patterns are formed.

The data line DL, first, second, and third source electrodes SE1, SE2, and SE3, first, second, and third drain electrodes DE1, DE2, and DE3, and first, second, and third end electrodes E1, E2 and E3 may be second metal patterns which are formed at substantially a same metal layer. The semiconductor layer 130 may be formed under the second metal pattern. The semiconductor layer 130 may include an amorphous silicon layer and an ohmic contact layer and may have a thickness of about 2200 Å. The protecting layer 150 is formed on the base substrate 101 on which the second metal patterns are formed. The first and second contact holes C1 and C2 are formed through the protecting layer 150 and, respectively, expose the first end electrode E1 and the second end electrode E2 through the protecting layer 150.

The organic layer 160 is formed on the protecting layer 150 corresponding to the first and second sub-areas SA1 and SA2.

The organic layer 160 may be formed of a transparent organic material or a photo-resist including dye.

The capping layer 170 is formed on the base substrate 101 on which the organic layer 160 is formed, to cover an upper side and a side of the organic layer 160. The capping layer 170 is formed between the organic layer 160 and the first and second sub-pixel electrodes SPE1 and SPE2 so that the capping layer 170 may prevent pollutants generated from the organic layer 160 from flowing into the LC layer 300.

The first sub-pixel electrode SPE1, the second sub-pixel electrode SPE2, the boosting electrode BE, the auxiliary electrode AE, and the shielding line SL may be transparent conductive patterns which are formed at substantially a same transparent conductive layer.

The first and second sub-pixel electrodes PE1 and PE2 are formed on the organic layer 160. The shielding line SL is formed on the data line DL to overlap the data line DL and is spaced apart from the first and second sub-pixel electrodes SPE1 and SPE2. The reference voltage Vcom is applied to the shielding line SL. The shielding line SL prevents a voltage of the data line DL from being changed so that the data voltage applied to the first and second sub-pixel electrodes SPE1 and SPE2 may be stabilized.

The boosting electrode BE is formed on the third end electrode E3 and at least partially overlaps the third end electrode E3. The capacitance of the boosting capacitor CBT may be defined by an overlapping area in which the boosting electrode BE and the third end electrode E3 overlap each other. A dielectric layer, which includes portions of the protecting layer 150 and the capping layer 170, is disposed between the boosting electrode BE and the third end electrode E3. The thickness of the dielectric layer includes the thickness of the portions of the protecting layer 150 and the capping layer 170. Each of the protecting layer 150 and the capping layer 170 is substantially thinner than the third end electrode E3, is substantially thinner than the gate insulating layer 120, and/or is substantially thinner than the semiconductor layer 130.

The auxiliary electrode AE is formed on the third end electrode E3, is spaced apart from the boosting electrode BE, and at least partially overlaps the third end electrode E3. The capacitance of the auxiliary capacitor CAX may be defined by an overlapping area in which the auxiliary electrode AE and the third end electrode E3 overlap each other. A dielectric layer, which includes portions of the protecting layer 150 and the capping layer 170, is disposed between the auxiliary electrode AE and the third end electrode E3.

The gate insulating layer 120 has a thickness of about 4400 Å, the protecting layer 150 has a thickness of about 700 Å to about 1000 Å, and the capping layer 170 has a thickness of about 700 Å. Each of the protecting layer 150 and the capping layer 170 is substantially thinner than the gate insulating layer 120.

Generally, if the thickness of the dielectric layer is decreased and if the overlapping area of electrodes is increased, the capacitance of the capacitor is increased. Therefore, if an area of the auxiliary electrode AE is substantially same, the capacitance of the auxiliary capacitor having the thin dielectric layer (which includes the protecting layer 150 and the capping layer 170 according to one or more embodiments) may be about 1.3 times to about 2 times more than the capacitance of an auxiliary capacitor having the end electrode E3 disposed under the gate insulating layer and having a thick dielectric layer that further includes the gate insulating layer 120 and the semiconductor layer 130.

As described with reference to FIGS. 3 and 4, the auxiliary capacitor CAX has the thin dielectric layer (which includes the protecting layer 150 and the capping layer 170) so that the capacitance of the auxiliary capacitor CAX may be sufficiently large without requiring a large area of the auxiliary electrode AE. Advantageously, the voltage ratio V1/V2 of the pixel P may be sufficiently large for providing desirable transmittance and visibility without causing loss in the aperture ratio.

The opposite substrate 200 includes a second base substrate 201. The opposite substrate 200 further includes a blocking pattern 210 and a common electrode layer 230 formed on the second base substrate 201.

The blocking pattern 210 is formed on the second base substrate 201 corresponding to the circuit area CA of the display substrate 100. The circuit area CA may be an area in which the first, second, and third switching elements TR1, TR2, and TR3, the boosting capacitor CBT, and the auxiliary capacitor CAX are formed.

The common electrode layer 230 is formed on the second base substrate 201 and is formed on the blocking pattern 210. The common electrode layer 230 may define the first LC capacitor CLC1 and the second LC capacitor CLC2 together with the first sub-pixel electrode SPE1 and the second sub-pixel electrode SPE2 of the display substrate 100.

FIGS. 6A to FIG. 6D are cross-sectional views illustrating a method of manufacturing the display substrate 100 of FIG. 5.

Figure 6A:
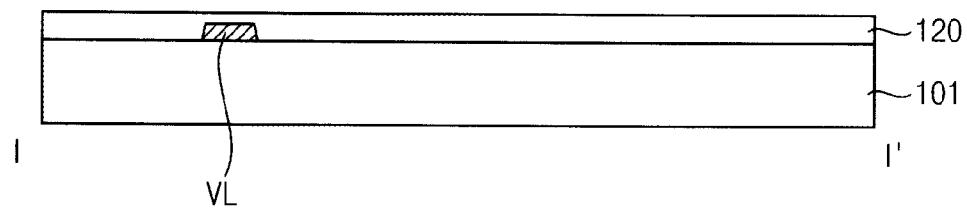
FIGS. 6A to FIG. 6D are cross-sectional views illustrating a method of manufacturing a display substrate of FIG. 5.

Referring to FIGS. 1 and 6A, a first metal layer is formed on the first base substrate 101 and the first metal layer is patterned to form a first metal pattern. The first metal pattern includes the main gate line GLm, the secondary gate line GLs, the voltage line VL, the first gate electrode GE1, the second gate electrode GE2, the third gate electrode GE3, etc.

The gate insulating layer 120 is formed on the first base substrate 101 on which the first metal pattern is formed. The gate insulating layer 120 may have a thickness of about 4400 Å.

Figure 6B:
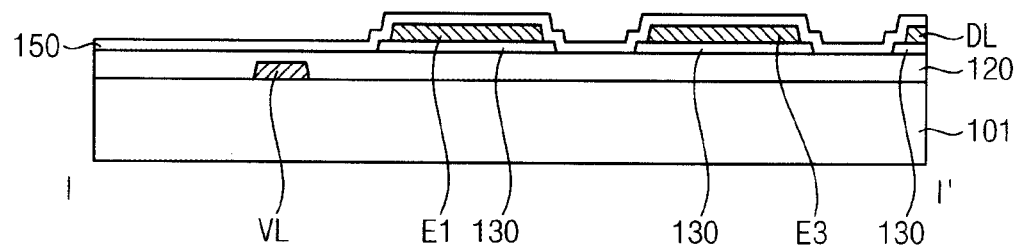

Referring to FIGS. 1 and 6B, the semiconductor layer 130 and a second metal layer are sequentially formed on the first base substrate 101, on which the gate insulating layer 120 is formed. The semiconductor layer 130 may have a thickness of about 2200 Å.

The semiconductor layer 130 and the second metal layer are patterned to form a second metal pattern. The second metal pattern includes the data line DL, the first, second and, third source electrodes SE1, SE2, and SE3, the first, second and, third drain electrodes DE1, DE2, and DE3, the first, second, and third end electrodes E1, E2, and E3, etc.

The protecting layer 150 is formed on the first base substrate 101 and is formed on the second metal pattern. The protecting layer 150 may have a thickness of about 1000 Å.

Figure 6C:
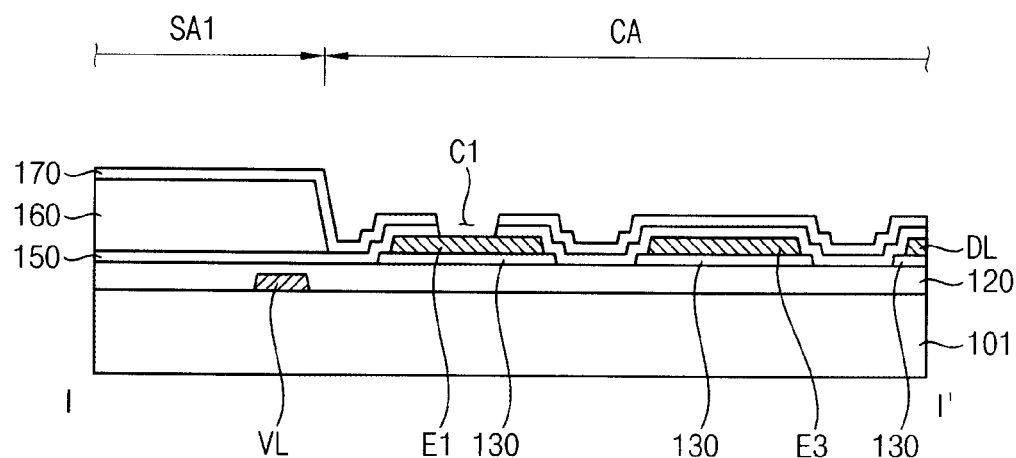

Referring to FIGS. 1 and 6C, the organic layer 160 is formed on the first base substrate 101 and is formed on the protecting layer 150. The organic layer 160 is patterned to be form in the first sub-area SA1 and the second sub-area SA2. In one or more embodiments, the organic layer 160 may not be formed in the circuit area CA.

The organic layer 160 may be formed of a transparent organic material or a photo-resist including dye. In one or more embodiments, the organic layer 160 may include one or more of a red filter, a green filter, and a blue filter.

The capping layer 170 is formed on the first base substrate 101 and is formed on the organic layer 160. The capping layer 170 may have a thickness of about 700 Å.

The capping layer 170 and the protecting layer 150 in the circuit area CA are etched to form the first and second contact holes C1 and C2.

Figure 6D:
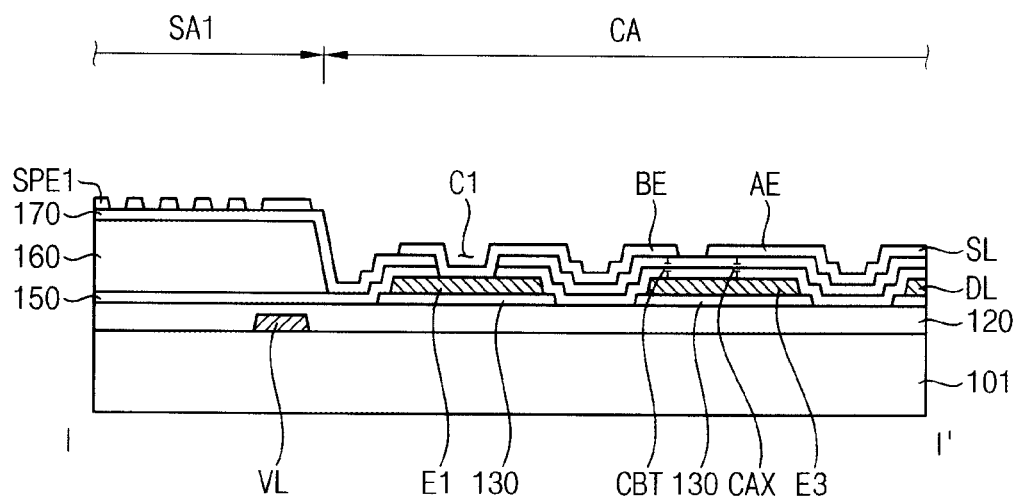

Referring to FIGS. 1 and 6D, a transparent conductive layer is formed on the first base substrate 101 on which the first and second contact holes C1 and C2 are formed. The transparent conductive layer is patterned to form a transparent conductive pattern. The transparent conductive pattern includes the first sub-pixel electrode SPE1, the second sub-pixel electrode SPE2, the shielding line SL, the boosting electrode BE, the auxiliary electrode AE, etc.

The first sub-pixel electrode SPE1 is formed in the first sub-area SA1 and is connected to the first switching element TR1 through the first contact hole C1. The second sub-pixel electrode SPE2 is formed in the second sub-area SA2 and is connected to the second switching element TR2 through the second contact hole C2.

The boosting electrode BE is connected to the first sub-pixel electrode SPE1 and at least partially overlaps the third end electrode E3. The auxiliary electrode AE is connected to the shielding line SL, is spaced apart from the boosting electrode BE, and at least partially overlaps the third end electrode E3.

Hereinafter, the same reference numerals may be used to refer to the same or like parts as those described in one or more of the previously-discussed embodiments, and any repetitive detailed explanation may be omitted.

Figure 7:
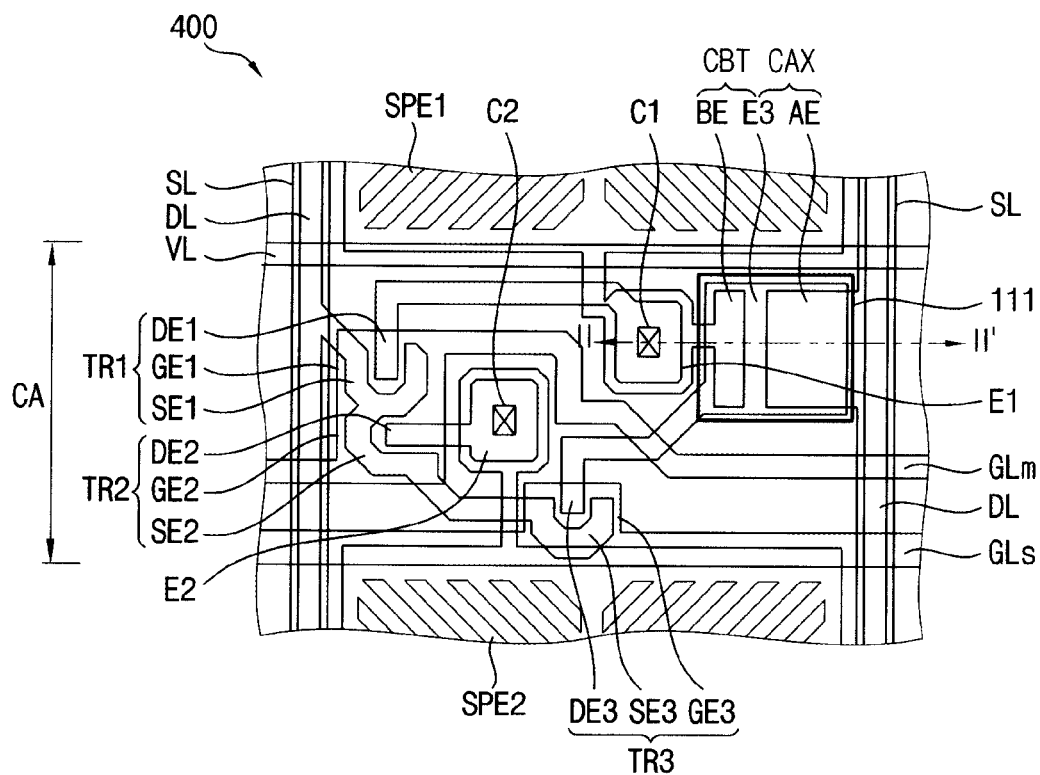
FIG. 7 is a plan view illustrating a display substrate according to one or more embodiments of the present invention.
Figure 8:
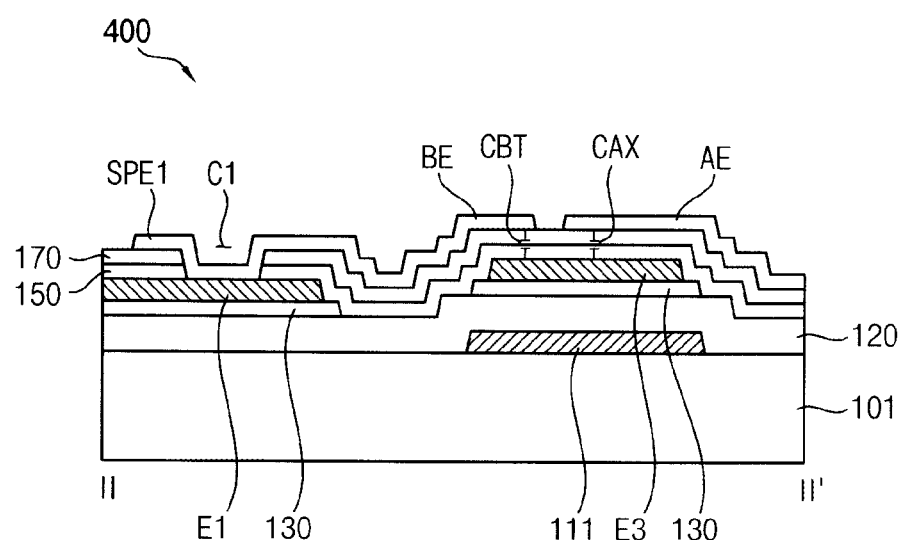
FIG. 8 is a cross-sectional view of the display substrate taken along a line II-II' of FIG. 7.

FIG. 7 is a plan view illustrating a display substrate 400 according to one or more embodiments of the present invention. FIG. 8 is a cross-sectional view of the display substrate 400 taken along a line II-II' of FIG. 7.

Referring to FIGS. 7 and 8, the display substrate 400 according to one or more embodiments includes a first switching element TR1, a second switching element TR2, a third switching element TR3, a first end electrode E1, a second end electrode E2, a third end electrode E3, a boosting electrode BE, an auxiliary electrode AE, and a blocking electrode 111. In comparison with the display substrate 100 discussed with reference to the example of FIG. 1, display substrate 400 includes the blocking electrode 111.

The blocking electrode 111 may be formed at the first metal layer, substantially where the main gate line GLm, the secondary gate line GLs, the voltage line VL, the first gate electrode GE1, the second gate electrode GE2, and the third gate electrode GE3 are formed.

The blocking electrode 111 overlaps the third end electrode E3 extended from the third drain electrode DE3 of the third switching element TR3. The blocking electrode 111 is electrically floated and shields the third end electrode E3 from light.

The boosting electrode BE is connected to the first sub-pixel electrode SPE1 and at least partially overlaps the third end electrode E3 to form the boosting capacitor CBT. The boosting capacitor CBT is defined by the boosting electrode BE, the third end electrode E3, and the dielectric layer (including the protecting layer 150) disposed between the boosting electrode BE and the third end electrode E3.

The auxiliary electrode AE is connected to the shielding line SL and at least partially overlaps the third end electrode E3 to form the auxiliary capacitor CAX. The auxiliary capacitor CAX is defined by the auxiliary electrode AE, the third end electrode E3, and the dielectric layer (including the protecting layer 150) disposed between the auxiliary electrode AE and the third end electrode E3.

The blocking electrode 111 blocks the light from the auxiliary capacitor CAX and the boosting capacitor CBT. In addition, the blocking electrode 111 prevents a photo leakage current from leaking from the semiconductor layer 130 (disposed under the third end electrode E3) via a maskless process so that a capacitance change of the auxiliary capacitor CAX and/or a capacitance change of the boosting capacitor CBT may be prevented.

Figure 9:
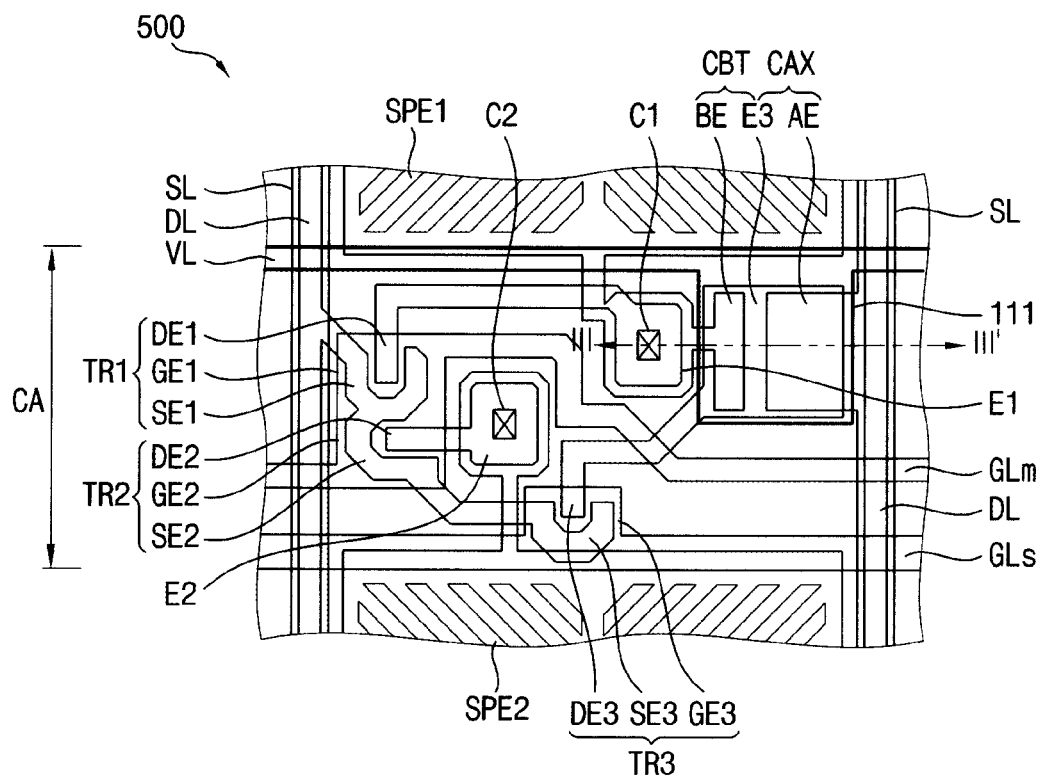
FIG. 9 is a plan view illustrating a display substrate according to one or more embodiments of the present invention.
Figure 10:
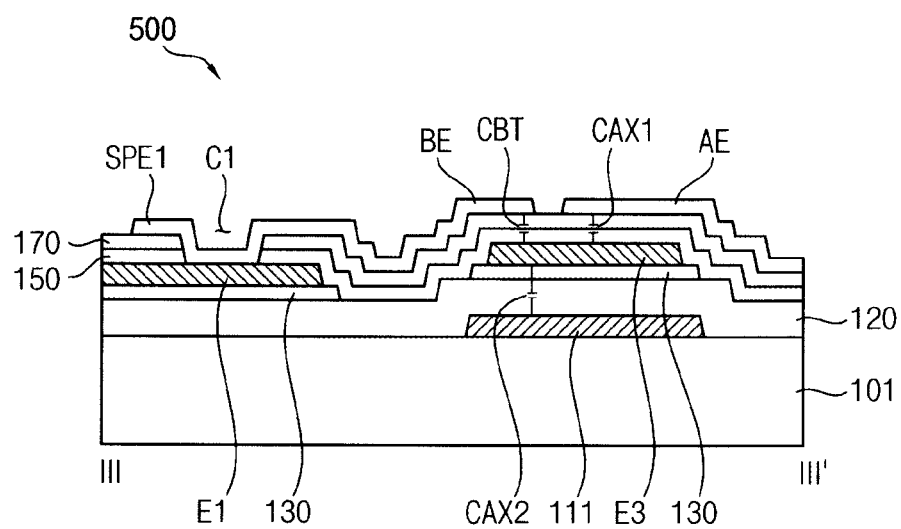
FIG. 10 is a cross-sectional view of the display substrate taken along a line III-III' of FIG. 9.

FIG. 9 is a plan view illustrating a display substrate 500 according to one or more embodiments of the present invention. FIG. 10 is a cross-sectional view of the display substrate 500 taken along a line III-III' of FIG. 9.

Referring to FIGS. 9 and 10, the display substrate 500 includes a first switching element TR1, a second switching element TR2, a third switching element TR3, a first end electrode E1, a second end electrode E2, a third end electrode E3, a boosting electrode BE, an auxiliary electrode AE, a voltage line VL, and a blocking electrode 111. In comparison with the display substrate 400 discussed with reference to the example of FIG. 7, the display substrate 500 includes the blocking electrode 111 connected to the voltage line VL.

The blocking electrode 111 is connected to the voltage line VL and at least partially overlaps the third end electrode E3. The blocking electrode 111 receives the reference voltage Vcom applied to the voltage line VL and blocks the third end electrode E3 from light.

The blocking electrode 111 is formed at the first metal layer, substantially where the main gate line GLm, the secondary gate line GLs, the voltage line VL, the first gate electrode GE1, the second gate electrode GE2, and the third gate electrode GE3 are formed.

The boosting electrode BE is connected to the first sub-pixel electrode SPE1 and at least partially overlaps the third end electrode E3 to form the boosting capacitor CBT. The boosting capacitor CBT is defined by the boosting electrode BE, the third end electrode E3, and the dielectric layer (including the protecting layer 150) between the boosting electrode BE and the third end electrode E3.

The auxiliary electrode AE is connected to the shielding line SL and at least partially overlaps the third end electrode E3 to form a first auxiliary capacitor CAX1. The first auxiliary capacitor CAX1 is defined by the auxiliary electrode AE, the third end electrode E3, and the dielectric layer (including the protecting layer 150) formed between the auxiliary electrode AE and the third end electrode E3.

In addition, the display substrate 500 further includes a second auxiliary capacitor CAX2 connected to the first auxiliary capacitor CAX1 in series. The second auxiliary capacitor CAX2 may be defined by the blocking electrode 111, the third end electrode E3, and the gate insulating layer 120 and the semiconductor layer 130 formed between the blocking electrode 111 and the third end electrode E3. The gate insulating layer 120 may have a thickness of about 4400 Å and the semiconductor layer 130 may have a thickness of about 2200 Å.

Therefore, if an area of the auxiliary electrode AE is substantially the same, the capacitance of the auxiliary capacitor, which includes the first and second auxiliary capacitors CAX1 and CAX2 according to one or more embodiments, may be about 2.3 times to about 3 times more than the capacitance of the single auxiliary capacitor CAX2.

Figure 11:
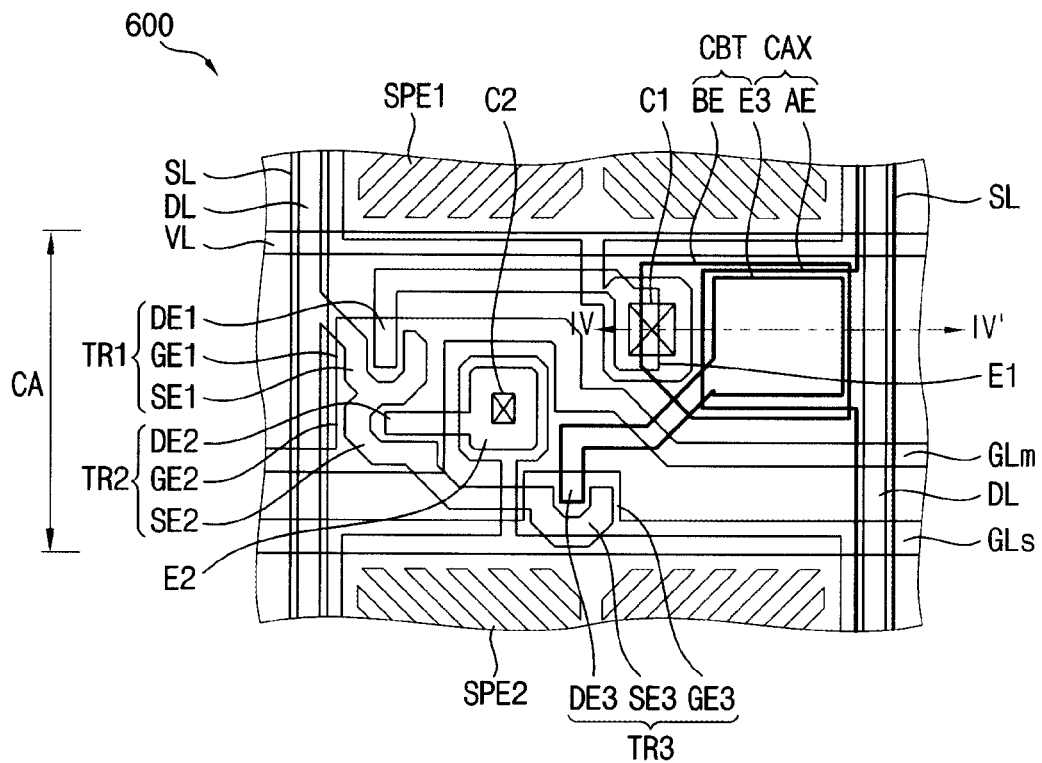
FIG. 11 is a plan view illustrating a display substrate according to one or more embodiments of the present invention.
Figure 12:
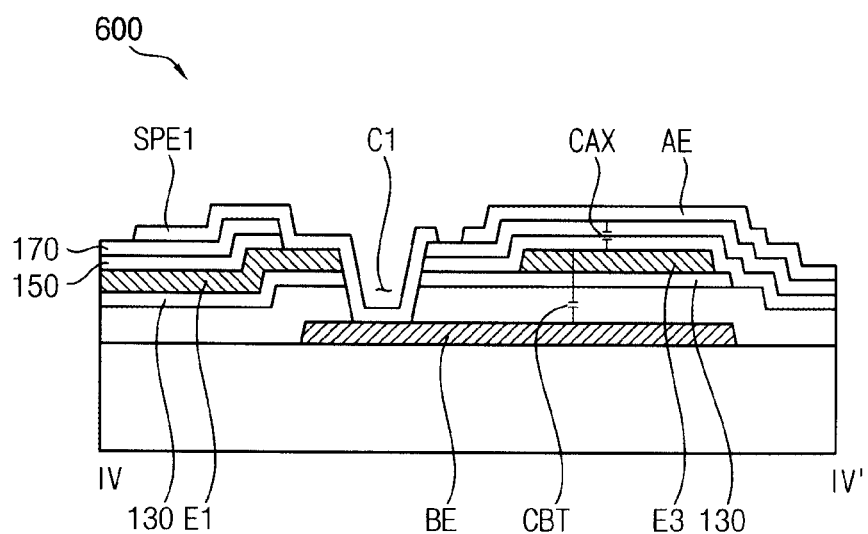
FIG. 12 is a cross-sectional view of the display substrate taken along a line IV-IV' of FIG. 11.

FIG. 11 is a plan view illustrating a display substrate 600 according to one or more embodiments of the present invention. FIG. 12 is a cross-sectional view of the display substrate 600 taken along a line IV-IV' of FIG. 11.

Referring to FIGS. 11 and 12, the display substrate 600 includes a first switching element TR1, a second switching element TR2, a third switching element TR3, a first end electrode E1, a second end electrode E2, a third end electrode E3, a boosting electrode BE, and an auxiliary electrode AE.

The first end electrode E1 extending from the first drain electrode DE1 of the first switching element TR1 is electrically connected to the first sub-pixel electrode SPE1 through the first contact hole C1. The first sub-pixel electrode SPE1 contacts an upper side of the first end electrode E1; SPE1 further contacts a second side of the first end electrode E1 through the first contact hole C1. The first end electrode E1 may at least partially overlaps the boosting electrode BE.

In addition, the first sub-pixel electrode SPE1 may contact the boosting electrode BE through the first contact hole C1. The boosting electrode BE overlaps the third end electrode E3 extending from the third drain electrode DE3 of the third switching element TR3 to form the boosting capacitor CBT. The boosting capacitor CBT is defined by the boosting electrode BE, the third end electrode E3, and the gate insulating layer 120 and the semiconductor layer 130 formed between the boosting electrode BE and the third end electrode E3.

In the display substrate 600, the first sub-pixel electrode SPE1, the first end electrode E1, and the boosting electrode BE contact each other through the first contact hole C1, but not limited thereto. For example, contact holes may be formed on each of the first end electrode E1 and the boosting electrode BE, and the first sub-pixel electrode SPE1 may contact each of the first end electrode E1 and the boosting electrode BE through the contact holes.

The boosting electrode BE may be formed at the first metal layer, substantially where the main gate line GLm, the secondary gate line GLs, the voltage line VL, the first gate electrode GE1, the second gate electrode GE2, and the third gate electrode GE3 are formed.

The auxiliary electrode AE is connected to the shielding line SL and overlaps the entire top surface of the third end electrode E3 to form the auxiliary capacitor CAX. The auxiliary capacitor CAX is defined by the auxiliary electrode AE, the third end electrode E3, and the dielectric layer (including the protecting layer 150) formed between the auxiliary electrode AE and the third end electrode E3. Since the auxiliary electrode AE overlaps the entire top surface of the third end electrode E3, the area of the auxiliary electrode AE overlapping the third electrode E3 is maximized, and the capacitance of the auxiliary capacitor CAX may be maximized.

The capacitance of the auxiliary capacitor CAX with the auxiliary electrode AE overlapping the entire top surface of the third end electrode E3 may be about 2.6 times to about 3.9 times more than the capacitance of an auxiliary capacitor with the auxiliary electrode AE overlapping only ½ of the top surface of the third end electrode E3.

According to one or more embodiments, the auxiliary capacitor CAX includes the auxiliary electrode AE extending from the shielding line SL, and the protecting layer 150 is substantially thin, so that the capacitance of the auxiliary capacitor CAX may be desirably large without requiring a large area of the auxiliary electrode AE. Therefore, desirable transmittance and visibility of the pixel may be provided without sacrificing the aperture ratio.

The foregoing is illustrative of the present invention and is not to be construed as limiting thereof. Although a few embodiments of the present invention have been described, those skilled in the art will readily appreciate that many modifications are possible in the embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A display substrate comprising:
    a base substrate;
    a data line, a main gate line, and a first sub-pixel electrode formed on the base substrate, the main gate line crossing the data line;
    a first switching element connected to the data line;
    a second switching element connected to the data line, the main gate line, and a second sub-pixel electrode, the second sub-pixel electrode being spaced apart from the first sub-pixel electrode;
    a third switching element connected to the data line and a secondary gate line, the secondary gate line being adjacent to the main gate line;
    a shielding line spaced apart from the first and second sub-pixel electrodes, the shielding line overlapping with the data line and receiving a reference voltage; and
    an auxiliary electrode extending from the shielding line and overlapping an end electrode electrically connected to the third switching element.

2. The display substrate of claim 1, wherein the auxiliary electrode partially overlaps the end electrode.

3. The display substrate of claim 2, further comprising:
    a blocking electrode disposed under the end electrode and overlapping the end electrode, the end electrode being disposed between the blocking electrode and the auxiliary electrode.

4. The display substrate of claim 3, further comprising:
    a voltage line receiving the reference voltage and disposed substantially parallel to the main gate line.

5. The display substrate of claim 4, wherein the blocking electrode is electrically connected to the voltage line.

6. The display substrate of claim 3, further comprising:
    a gate insulating layer disposed on the base substrate to cover the main gate line and the secondary gate line,
    wherein the gate insulating layer is disposed between the blocking electrode and the end electrode.

7. The display substrate of claim 6, further comprising:
    a semiconductor layer disposed between the gate insulating layer and the end electrode.

8. The display substrate of claim 6, further comprising:
    a protecting layer having first and second contact holes formed through the protecting layer, the first switching element being connected to the first sub-pixel electrode through the first contact hole, the second switching element being connected to the second sub-pixel electrode through the second contact hole.

9. The display substrate of claim 8, further comprising:
    a boosting electrode extending from the first sub-pixel electrode, spaced apart from the auxiliary electrode, and at least partially overlapping the end electrode.

10. The display substrate of claim 8, wherein the protecting layer is disposed between the end electrode and the auxiliary electrode.

11. The display substrate of claim 8, wherein the auxiliary electrode overlaps an entire top surface of the end electrode.

12. The display substrate of claim 8, further comprising:
    a boosting electrode disposed under the end electrode and overlapping the end electrode,
    wherein the gate insulating layer is disposed between the end electrode and the boosting electrode.

13. The display substrate of claim 12, wherein the first sub-pixel electrode is connected to the boosting electrode through a third contact hole, wherein the third contact hole is formed through the gate insulating layer and the protecting layer.

14. The display substrate of claim 8, further comprising:
an organic layer disposed between the protecting layer and the first sub-pixel electrode, the organic layer being further disposed between the protecting layer and the second sub-pixel electrode.

15. The display substrate of claim 14, wherein the organic layer includes dye.

16. The display substrate of claim 14, further comprising:
a capping layer disposed between the organic layer and the first sub-pixel electrode, the capping layer being further disposed between the organic layer and the second sub-pixel electrode.

17. The display substrate of claim 16, wherein the capping layer and the protecting layer are disposed between the end electrode and the auxiliary electrode.

18. The display substrate of claim 1, wherein the first switching element includes a first gate electrode electrically connected to the main gate line, a first source electrode electrically connected to the data line, and a first drain electrode electrically connected to the first sub-pixel electrode, the second switching element includes a second gate electrode electrically connected to the main gate line, a second source electrode electrically connected to the data line, and a second drain electrode electrically connected to the second sub-pixel electrode, the third switching element includes a third gate electrode electrically connected to the secondary gate line, a third source electrode electrically connected to the data line, and a third drain electrode electrically connected to the auxiliary electrode and a boosting electrode, wherein the boosting electrode extends from the first sub-pixel electrode, and the end electrode extends from the third drain electrode.

19. The display substrate of claim 18, wherein the secondary gate line is electrically connected to at least one of a plurality of next main gate lines, the plurality of next main gate lines being arranged next to the main gate line.

20. The display substrate of claim 19, wherein the secondary gate line is connected to a next main gate line connected to a next first sub-pixel electrode, the next first sub-pixel electrode receiving a data voltage having a polarity substantially same as that of a data voltage provided to the first sub-pixel electrode.

* * * * *